United States Patent [19]
Jones et al.

[11] Patent Number: 6,061,817
[45] Date of Patent: *May 9, 2000

[54] METHOD AND APPARATUS FOR GENERATING TEST PATTERN FOR SEQUENCE DETECTION

[75] Inventors: Christopher W. Jones, Pleasanton, Calif.; Peter L. Higginson, Reading, United Kingdom

[73] Assignee: Cypress Semiconductor Corp., San Jose, Calif.

[*] Notice: This patent is subject to a terminal disclaimer.

[21] Appl. No.: 08/982,730

[22] Filed: Dec. 2, 1997

Related U.S. Application Data

[63] Continuation-in-part of application No. 08/826,882, Apr. 7, 1997, Pat. No. 5,764,657, which is a continuation of application No. 08/660,932, Jun. 10, 1996, abandoned.

[51] Int. Cl.$^7$ .................................................. G01R 31/28
[52] U.S. Cl. ........................... 714/738; 714/728; 364/717
[58] Field of Search .................................... 714/738, 728, 714/739, 819, 735; 324/158.1, 73.1; 364/717

[56] References Cited

U.S. PATENT DOCUMENTS

| | | | |
|---|---|---|---|
| 5,144,230 | 9/1992 | Katoozi et al. | 324/158 |
| 5,258,986 | 11/1993 | Zerbe | 714/719 |
| 5,383,143 | 1/1995 | Crouch et al. | 364/717 |
| 5,390,192 | 2/1995 | Fujieda | 714/738 |
| 5,541,942 | 7/1996 | Strouss | 714/720 |
| 5,568,437 | 10/1996 | Jamal | 365/201 |
| 5,764,657 | 6/1998 | Jones | 371/27.1 |

OTHER PUBLICATIONS

"Testing of Embedded RAM Using Exhaustive Random Sequences," 1987 International Test Conference Proceedings, The Computer Society of the IEEE, Paper 4.2, pp. 105–110, Catalog CH2347–2, Feb. 1987.

"LSSD Compatible and Concurrently Testable RAM," 1992 International Test Conference Proceedings, The Computer Society of the IEEE, Paper 31.2, pp. 608–614, Catalog 0–8186–3167, Aug. 1992.

"Embedded RAM Testing," *Institute of Electrical and Electronics Engineers, Inc.*, pp. 29–33, Catalog 0–8186–7102, May 1995.

"CPLD Optimizes Serial Test Patterns," *Electronic Design*, pp. 118, 120, Dec. 2, 1996.

"Synchronous Sequential Circuit Design II," *Digital Devices Design Laboratory EE3111*, Fourth Edition, Mississippi State University, pp. 66–68.

*Primary Examiner*—Hoa T. Nguyen
*Attorney, Agent, or Firm*—Christopher P. Maiorana, P.C.

[57] ABSTRACT

A method and apparatus for generating a serial test pattern for sequence detection. The serial test pattern has a first plurality of bits and is generated by a pattern generator. A second plurality of bits is generated having a first value. The second plurality of bits includes less bits than the first plurality of bits. The first value of the second plurality of bits is then compared with one or more numbers to generate a comparison result. A next bit is then generated in the serial pattern based upon the comparison result and one or more bits of the second plurality of bits.

36 Claims, 10 Drawing Sheets

6,061,817

METHOD AND APPARATUS FOR GENERATING TEST PATTERN FOR SEQUENCE DETECTION

CROSS REFERENCE TO RELATED APPLICATIONS

This application is a continuation-in-part of U.S. Pat. Ser. No. 08/826,882 filed Apr. 7, 1997 now U.S. Pat. 5,764,657, which is a continuation of U.S. Pat. Ser. No. 08/660,932 filed Jun. 10, 1996, abandoned.

BACKGROUND OF THE INVENTION

1. Field of the Invention

The present invention relates to test pattern generation and detection. More particularly, the present invention relates to a method and apparatus for generating a test pattern for testing a sequence detection state machine or other circuitry in an electronic device.

2. Background of the Invention

Many electronic devices (e.g. integrated circuits, systems, etc.) have a circuit that receives a serial input stream of data and performs an action in response to the serial input stream.

An electronic device may include a sequence detecting state machine that constantly monitors and evaluates the serial input stream. When a particular pattern is detected in the serial input stream, the sequence detecting state machine causes the electronic device to perform an action. For example, the electronic device may latch data provided on an input bus when the sequence detecting state machine determines that the serial input stream includes a bit pattern that instructs the electronic device to load input data.

When the sequence detecting state machine does not recognize a pattern in the serial input stream, the sequence detecting state machine does not instruct the electronic device to perform an action.

Typically, the serial input stream of data is stored in a register that can then be read by the sequence detecting state machine or by another circuit within the electronic device. Without the use of a sequence detecting state machine, the other circuit may perform an action in response to the serial input stream. For example, the other circuit may comprise an addressable memory circuit and the register may comprise an address register. The address register may be serially loaded with address information of an addressable memory location in the memory circuit. If the address register comprises n bits, there are $2^n$ possible n-bit address locations that can be loaded into the address register. The serial input stream may comprise all $2^n$ possible n-bit addresses to test that each address may be properly selected.

If the sequence detecting state machine or other circuit responds to or evaluates an n-bit pattern in the serial stream of data, then in order to completely test whether the sequence detecting state machine or other circuit is functioning properly, $2^n$ unique patterns must be supplied to the electronic device. The response of the sequence detecting state machine, other circuitry, and the electronic device must be monitored for each of the $2^n$ unique patterns.

Each unique n-bit pattern may be separately provided to the electronic device. This technique, however, would require a minimum of $n \times 2^n$ cycles to load all n-bit patterns into the electronic device. For example, if n equals three, then it would be possible in 24 cycles ($3 \times 2^3$) to provide to the electronic device the patterns of 000, 001, 010, ..., 111.

A serial pattern for supplying the 64 combinations of a six-bit pattern has been used to test a sequence detecting state machine which monitors six-bit patterns. The serial pattern comprises:

0000001111111010101100110111011010010011100010111100101000110000100000.

However, a method of generating this serial pattern has not been known by others.

It is desirable to generate a serial input stream including all possible n-bit patterns and requiring less than $n \times 2^n$ cycles to serially load into an electronic device. It is also desirable to have the serial input stream be as short as possible to save time in loading the serial input stream into an electronic device under test. Additionally, it is desirable to have a short serial input stream to save time in testing a sequence detecting state machine or other circuitry in an electronic device.

Reducing the time for testing the electronic device saves the device manufacturer and end-user both time and money.

OBJECTS OF THE INVENTION

Accordingly, one object of the present invention is to reduce the time for testing an electronic device.

It is another object of the invention to provide a serial bit stream having all possible n-bit patterns but requiring less than $n \times 2^n$ cycles to serially load into an electronic device.

Other objects, advantages, features and characteristics of the present invention, as well as methods, operation and functions of related elements of structure, and the combination of parts and economies of manufacture, will become apparent upon consideration of the following summary, description and claims with reference to the accompanying drawings, all of which form a part of this specification, wherein like reference numerals designate corresponding parts in the various figures.

SUMMARY OF THE INVENTION

Accordingly, the present invention provides a method for generating a serial test pattern for sequence detection. The serial test pattern includes a first plurality of bits. For example, the first plurality of bits may be 0001110100. A second plurality of bits having a first value is also generated. The second plurality of bits includes less bits than the first plurality of bits. For example, the second plurality of bits may be 000, 001, 010, 011, 100, 101, 110 or 111. The respective first values would then be 0, 1, 2, 3, 4, 5, 6, 7. The first value of the second plurality of bits is then compared with one or more numbers to generate a comparison result. For example, the first value may be compared to a range of numbers from one to four. A next bit in the serial pattern is then generated based upon the comparison result and at least one bit of the second plurality of bits.

In accordance with an aspect of the invention, one or more bits from the second plurality of bits is selected based on the number of bits in the second plurality of bits, and the next bit is generated based upon the comparison result and the one or more bits selected. Preferably, the next bit in the serial pattern is generated having a first state if the first value is equal to one of the one or more numbers and is generated having a second state which is the complement of the first state if the first value is not equal to any of the one or more numbers.

In accordance with another aspect of the invention, a pattern generator includes a sequence generator configured to output a serial sequence of bits and a plurality of bits having a value. The sequence generator is coupled to a comparator. The comparator is configured to generate a comparison result in response to a comparison of the value of the plurality of bits and one or more numbers. The pattern generator further includes a next bit generator configured to receive the comparison result and at least one of the plurality of bits from the sequence generator. Based upon the comparison result and at least one of the plurality of bits, a next bit generator is configured to generate a next bit for the serial sequence of bits. Beneficially, a selector is configured to select one or more bits from the plurality of bits based on the number of bits in the plurality of bits, and the next bit is generated based upon the comparison result and the one or more bits selected.

It is desirous that the comparison result is a first result value when the plurality of bits is equal to one of the one or more numbers, and the comparison result is a second result value when the plurality of bits is not equal to any of the one or more numbers. In such a case, the next bit has a first state if the comparison result is the first result value, and the next bit has a second state which is the complement of the first state if the comparison result is the second result value.

The invention is also implemented to test a device.

The invention is also implemented in a medium readable by a digital signal processing device.

Other features and advantages of the present invention will be apparent from the accompanying drawings and from the detailed description that follows.

BRIEF DESCRIPTION OF THE DRAWINGS

The features and advantages of the present invention are illustrated by way of example and are by no means intended to limit the scope of the present invention to the particular embodiments shown.

DETAILED DESCRIPTION OF A PREFERRED EMBODIMENT OF THE INVENTION

A method and apparatus for generating a test pattern for sequence detection is described. In the following description, for purposes of explanation, specific nomenclature is set forth to provide a thorough understanding of the present invention. However, it will be apparent to one skilled in the art that these specific details are not required to practice the present invention. In other instances, well known circuits and devices are shown in block diagram form to avoid obscuring the present invention unnecessarily.

Figure 1:
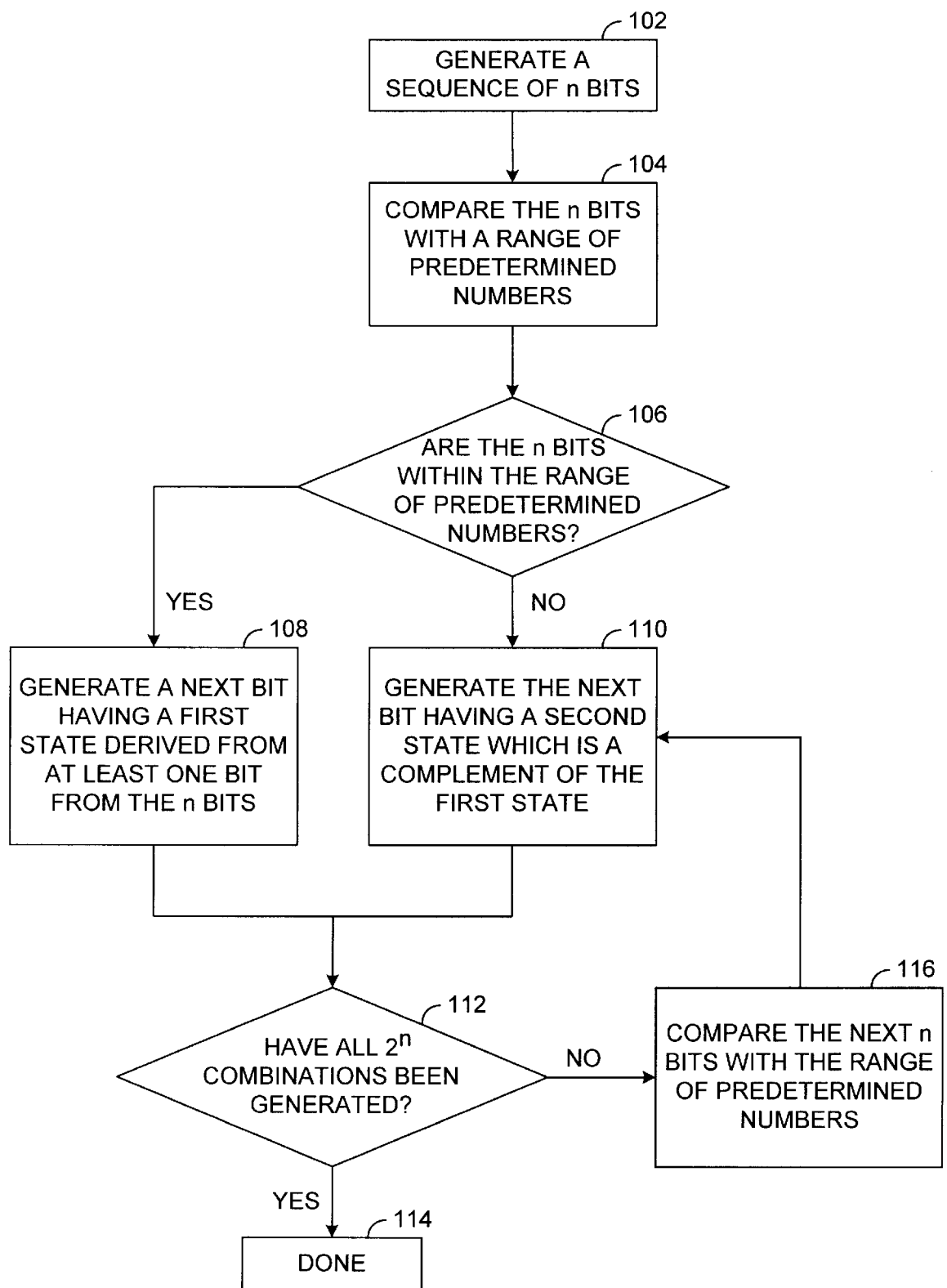
FIG. 1 is a flow chart illustrating a method of generating a test pattern according to one embodiment of the present invention.

FIG. 1 is a flow chart which outlines the general steps required to generate a test pattern for testing a sequence detecting state machine or other circuitry under test in an electronic device. The method or process illustrated in FIG. 1 generates a serial test pattern of bits which comprises all $2^n$ possible combinations of an n-bit pattern. The serial pattern comprises only $2^n+n-1$ bits the first time the serial test pattern is generated. If the serial test pattern is repeated, only $2^n$ cycles are required to reproduce the serial test pattern. All $2^n$ combinations of an n-bit pattern appear in the serial test pattern one time only.

As described in more detail below, the method may be implemented by a pattern generator circuit or other digital signal processing device. Alternatively, the method of FIG. 1 may comprise a sequence of software instructions which causes circuitry to generate a serial test pattern as outlined in FIG. 1.

The method of generating a serial test pattern starts by generating a first sequence of n bits at step 102. For one embodiment, the first sequence of n bits comprises bits generated after a reset function of a pattern generator.

The first sequence of n bits has a value that may be expressed in base ten, hexadecimal, or other number formats. For purposes of illustration, and not by way of limitation, base ten is used throughout this description.

At step 104, the first sequence of n bits is compared with a range of predetermined numbers. The range of predetermined numbers may comprise one number or a plurality of numbers.

For one embodiment, the range of predetermined numbers is from one to $2^{n-1}$ inclusive. For another embodiment, the range of numbers comprises zero and the range of $2^{n-1}+1$ to $2^n$ inclusive. For another embodiment, the range of predetermined numbers is from $2^{n-1}-1$ to $2^n-2$ inclusive. For another embodiment, the range of predetermined numbers comprises 0 to $2^{n-1}2$ and $2^n-1$ to $2^n$ inclusive.

At step 106, the method determines whether the value of the first sequence of n bits is included within the range of predetermined numbers. If the value of the first sequence of n bits is included within the set of predetermined numbers, the method transitions to step 108 and generates the next bit in the pattern. The next bit in the pattern is derived as a function of one or more of the bits in the first sequence of n bits.

If the value of the first sequence of n bits is not included within the range of predetermined numbers, the method transitions from step 106 to step 110 and generates the next bit in the pattern. The next bit in the pattern is derived as the complement of the same function as utilized in step 108 of one or more of the bits in the first sequence of n bits.

In other words, the next bit generated in steps 108 or 110 has a state which is logically derived from the state of one or more of the bits in the first sequence of bits and the state of the next bit generated in step 110 is the complement of the state of the next bit generated in step 108.

Both steps 108 and 110 transition to step 112 after the next bit in the pattern has been generated. If all $2^n$ combinations for the n-bit pattern have been generated, the process stops at step 114. If all $2^n$ combinations for the n-bit pattern have not been generated, the process compares the next group of n bits with the range of predetermined numbers at step 116. The next group of n bits is the first sequence of n bits shifted by one location and having a least significant bit equal to the next bit determined in step 108 or step 110. The process then transitions back to step 106.

For another embodiment, the process does not stop if all $2^n$ combinations of the n-bit pattern have been generated; rather, the process continues to cycle through the unique serial test pattern generated by the process of FIG. 1.

The operation of the method shown in FIG. 1 may best be illustrated by way of example. For one example, n equals three and the method of FIG. 1 generates the following serial sequence of bits: 0001110100. Reading three bit groups from left to right, this pattern covers the three-bit patterns from zero to seven in the order of: 0, 1, 3, 7, 6, 5, 2, and 4. The pattern is cyclical and will repeat itself.

The sequence of bits may be output from a pattern generator circuit or other circuit from left to right or from right to left. The method of FIG. 1 generates this pattern as follows.

At step 102, a first sequence of three bits is generated. The first sequence of three bits comprises 000. These bits may be generated by performing a reset function within the pattern generator. Given that the above pattern is cyclical, any three bits of the serial sequence may comprise the first sequence of three bits. For this example, the first three bits comprise 000.

At step 104, 000 is compared with the predetermined range of numbers from one to $2^{n-1}$, that is, a range from one to four ({1,4}) inclusive. At step 106, it is determined that 000 (zero) is not within the range {1,4} and the process proceeds to step 110. At step 110, the next bit is determined to be the complement of the last or least significant bit in the first sequence of 000. Reading from left to right, the last bit in the sequence is a zero. Therefore, the next bit in the pattern is set to be a one.

At step 112, it is determined that not all of the eight ($2^3$) combinations of the three-bit pattern have been generated, and the process transitions to step 116. At step 116, the next three bits are compared with the range {1,4}. The next three bits now comprise 001 and have the decimal value of one. Step 106 determines that the value one is within the range {1,4} and the process transitions to step 108. At step 108, the next bit in the pattern is generated and has the same state as the last or least significant bit. Reading from left to right, the last bit in the sequence is a one. Therefore, the next bit in the pattern is set to be a one.

The process will continue until all eight ($2^3$) combinations of the three-bit pattern have been generated. A summary of this example is illustrated in Table 1.

TABLE 1

| n bits | base 10 | last bit | next bit |
| --- | --- | --- | --- |
| 000 | 0 | 0 | 1 |
| 001 | 1 | 1 | 1 |
| 011 | 3 | 1 | 1 |
| 111 | 7 | 1 | 0 |
| 110 | 6 | 0 | 1 |
| 101 | 5 | 1 | 0 |
| 010 | 2 | 0 | 0 |
| 100 | 4 | 0 | 0 |

For another example, n equals three and the method illustrated in FIG. 1 generates the following serial test pattern: 1110001011. This serial test pattern is the complement of the pattern 0001110100 illustrated in the first example. Reading three bit groups from left to right, the pattern 1110001011 covers the three-bit patterns from zero to seven in the order of: 7, 6, 4, 0, 1, 2, 5, and 3. The pattern is cyclical and will repeat itself. Thus, the test pattern could be shifted to comprise 0001011100 so that the three-bit patterns are in the order of: 0, 1, 2, 5, 3, 7, 6, and 4.

The pattern may be output from a pattern generator circuit or other circuit from left to right or from right to left. The method of FIG. 1 generates this pattern as follows.

At step 102, a first sequence of three bits is generated. The first sequence of three bits comprises 111. These bits may be generated by performing a reset function within the pattern generator. The above pattern is cyclical such that any three bits may comprise the first sequence of three bits. For this example, the first three bits comprise 111.

At step 104, 111 is compared with the range of predetermined numbers from $2^{n-1}-1$ to $2^n-2$ inclusive, that is, a range from three to six ({3,6}) inclusive. The bit pattern 111 has the decimal value of seven. At step 106, it is determined that 111 (seven) is not within the range {3,6} and the process proceeds to step 110. At step 110, the next bit is determined to be the complement of the last or least significant bit in the first sequence of 111. Reading from left to right, the last bit in the sequence is a one. Therefore, the next bit in the pattern is set to be a zero.

At step 112, it is determined that not all of the eight ($2^3$) combinations of the three-bit pattern have been generated, and the process transitions to step 116. At step 116, the next three bits are compared with the range {3,6}. The next three bits now comprise 110. These three bits have the decimal value of six. Step 106 determines that six is within the range {3,6} and the process transitions to step 108. At step 108, the next bit in the pattern has the same state as the last or least significant bit. Reading from left to right, the last bit in the sequence is a zero. Therefore, the next bit in the pattern is set to be a zero.

The process will continue until all eight ($2^3$) combinations of the three-bit pattern have been generated. A summary of this example is illustrated in Table 2.

TABLE 2

| n bits | base 10 | last bit | next bit |
| --- | --- | --- | --- |
| 111 | 7 | 1 | 0 |
| 110 | 6 | 0 | 0 |
| 100 | 4 | 0 | 0 |
| 000 | 0 | 0 | 1 |
| 001 | 1 | 1 | 0 |
| 010 | 2 | 0 | 1 |
| 101 | 5 | 1 | 1 |
| 011 | 3 | 1 | 1 |

The foregoing method illustrated in FIG. 1 may be extended to any n-bit pattern having $2^n$ combinations. The unique serial test pattern generated by the method of FIG. 1 will comprise $2^n+n-1$ bits. If the pattern is repeated or cycled, then only $2^n$ bits will be generated to repeat each of the $2^n$ combinations. All $2^n$ combinations will appear in this serial test pattern one time only.

For another example, when n equals four and the predetermined range of numbers comprises the range 1 to $2^{n-1}$ or {1,8}, the test pattern generated by the method illustrated in FIG. 1 is: 00001111101011001000. This pattern covers the four-bit patterns from zero to fifteen in the order of: 0, 1, 3, 7, 15, 14, 13, 10, 5, 11, 6, 12, 9, 2, 4 and 8. This pattern is cyclical and will repeat itself.

For another example, when n equals four and the predetermined set of numbers comprises the range $2^{n-1}-1$ to $2^n-2$ or {7,14}, the test pattern generated by the method illustrated in FIG. 1 is: 1111000010100110111. This pattern is the complement of the pattern 0000111101011001000 illustrated in the first example. The pattern 1111000010100110111 covers the four-bit patterns from zero to fifteen in the order of: 15, 14, 12, 8, 0, 1, 2, 5, 10, 4, 9, 3, 6, 13, 11, and 7. This pattern is cyclical and will repeat itself.

Figure 2:
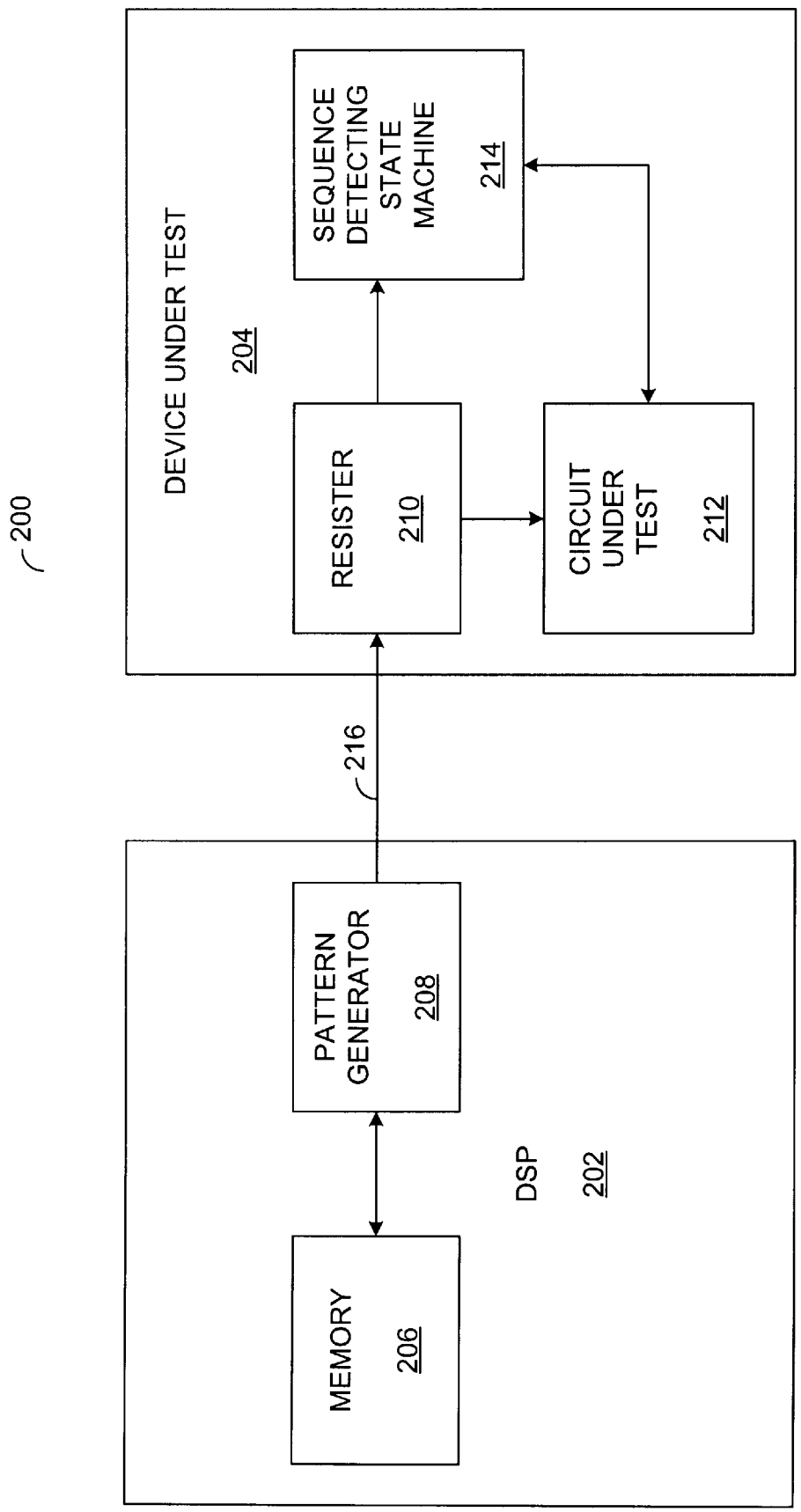
FIG. 2 is a block diagram of one embodiment of the present invention.

The method of FIG. 1 may be implemented in system 200 shown in FIG. 2. System 200 includes a digital signal processing device (DSP) 202 communicating with device under test 204. DSP 202 generates the serial test pattern described in FIG. 1 for testing device under test 204. DSP 202 may comprise a logic analyzer, automatic testing equipment (ATE) used in integrated circuit production testing, a signal generator, a computer, or other type of digital signal processor that can generate a pattern of bits or signals. Alternatively, DSP 202 may comprise a circuit simulator which generates inputs for testing, a circuit model of device under test 204.

DSP 202 includes pattern generator 208 and memory 206. Pattern generator 208 may comprise circuitry that can implement a pattern. For example, pattern generator 208 may comprise programmable logic device(s) such as PLDs, FPGAs, or other types of programmable logic that can be programmed to implement the method illustrated in FIG. 1. Alternatively, pattern generator 208 may comprise dedicated hardware or circuitry that generates the method illustrated in FIG. 1. Embodiments of pattern generator 208 will be described in more detail below.

Memory 206 is a medium that stores a series of instructions which cause pattern generator 206 and DSP 202 to implement or perform the method illustrated in FIG. 1. For one embodiment, memory 206 is RAM including SRAM, DRAM, VRAM or other types of RAM memory. For another embodiment, memory 206 is a ROM, PROM, EPROM, EEPROM or other types of ROM memory. For another embodiment, memory 206 is FLASH memory. For another embodiment, memory 206 is a programmable logic device including PLDS, FPGAS, or other types of programmable logic that can implement a state machine according to the method illustrated in FIG. 1.

For yet another embodiment, memory 206 is a floppy disk, hard drive, or other type of magnetic storage medium. Alternatively, memory 206 may comprise a digital compact disk, optical disk or any other type or storage medium.

Device under test 204 has a serial input for receiving the serial test pattern on line 216 from DSP 202. Device under test 204 includes register 210 which is coupled to line 216. Register 210 receives and stores the serial test pattern generated by DSP 202. For one embodiment, register 210 has n bit locations for storing n bits in the serial test pattern. For this embodiment, $2^n$ possible combinations can be represented by the n bits in register 210. For another embodiment, register 210 stores more or less than n bits at one time.

Device under test 204 also includes sequence detecting state machine 214 and circuit under test 212. For one embodiment, only one of sequence detecting state machine 214 or circuit under test 212 is included within device under test 204.

Sequence detecting state machine 214 monitors and evaluates n bits of the serial test pattern stored in register 210. When a particular pattern is detected by sequence detecting state machine 214, device under test 204 will perform a given action. In the example outlined above where n equals three and the serial test pattern comprises the pattern: 0001110100, sequence detecting state machine 214 monitors three bits at any given time. For one embodiment, sequence detecting state machine 214 monitors the sequence for the pattern 011. When this three-bit pattern is loaded into register 210, sequence detecting state machine 214 causes device under test 204 to perform an action (e.g. load input data, or write data into memory location in device under test 204, etc.). This action may then be monitored by testing device under test 204 to see if the action correctly took place. In this embodiment, all other patterns besides 011 should not cause device under test 204 to perform any action. Device under test 204 may also be tested to ensure that no action occurs in response to other patterns.

For one embodiment, sequence detecting state machine 214 may comprise a data communication device communicating with DSP 202. Device under test 204 will receive communication packets which have header data or other frame initializing data. Sequence detecting state machine 214 will monitor the incoming data stored in register 210 until a unique n-bit sequence is encountered which identifies the particular header or frame initializer. Therefore, the functionality of the data communication device may be tested by having DSP 202 implement the method of FIG. 1. According to the method of FIG. 1, a short serial stream of bits comprising all possible n-bit patterns will be supplied to device under test 204. Device under test 204 will then be tested to make sure that it correctly responds to only the n-bit pattern which has the header or frame initializing data.

Circuit under test 212 also monitors and evaluates n bits stored in register 210. When a particular pattern is detected by circuit under test 212, circuit under test 212 will perform an action. For example, device under test 204 may comprise a memory device such as a static random access memory device (SRAM), circuit under test 212 may comprise row or column decoders, and register 210 may comprise an address register having n bits. Register 210 can produce $2^n$ addresses for addressing $2^n$ memory locations. The method of FIG. 1 can be used to serially load all 2n addresses into register 210 and test whether all memory locations can be properly addressed. Alternatively, register 210 may comprise a data register in a memory device. Register 210 may then be loaded with all 2n combinations of data to verify that all such combinations may be written into a particular memory location.

Any device or system that uses an address may use the method of FIG. 1 and the system of FIG. 2 to quickly load and test the selection of all address locations. Moreover, any device that uses a data register or a data field will benefit from the savings in test time associated with using the method illustrated in FIG. 1.

For another embodiment, device under test 204 comprises an integrated circuit or system having a serial test interface. For this embodiment, register 210 may comprise an instruction register, address register, data register, or other register element. If register 210 is an instruction register, the response of device under test 204 to all instructions may be quickly verified. A first instruction may loaded with a first n bits and the response of device under test 204 monitored. A next instruction may then be loaded into register 210 in only one clock cycle. The entire instruction register does not have to be reloaded with a new instruction. This process can then continue until all instructions have been loaded, and only $2^n+n-1$ clock cycles are required to load all of the instructions the first time. The functionality of the data registers, address registers, and other registers may be also be tested in like manner.

For one embodiment, the serial test interface may be compatible with IEEE Std 1149.1-1990 and 1149.la-1993 entitled IEEE Standard Test Access Port and Boundary-Scan Architecture (IEEE Std 1149.1), ISBN 1-55937-350-4, which is commonly referred to as the JTAG (Joint Test Access Group) specification.

For one embodiment, register 210 is not required and sequence detecting state machine 214 or circuit under test 212 may directly receive the serial input pattern from DSP 202 via line 216.

For another embodiment, pattern generator 208 may be included within device under test 204. For this embodiment, device under test 204 may include a built-in self-test circuit (BIST) such that pattern generator 208 provides the serial test pattern generated by the method of FIG. 1 in response to a stimulus. The stimulus may be an external signal or voltage which causes the built-in self-test circuit to start functioning. In this embodiment, pattern generator 208 would provide the serial test pattern directly to register 210, sequence detecting state machine 214, or circuit under test 212.

For another embodiment, memory 206 may be included within device under test 204.

Figure 3:
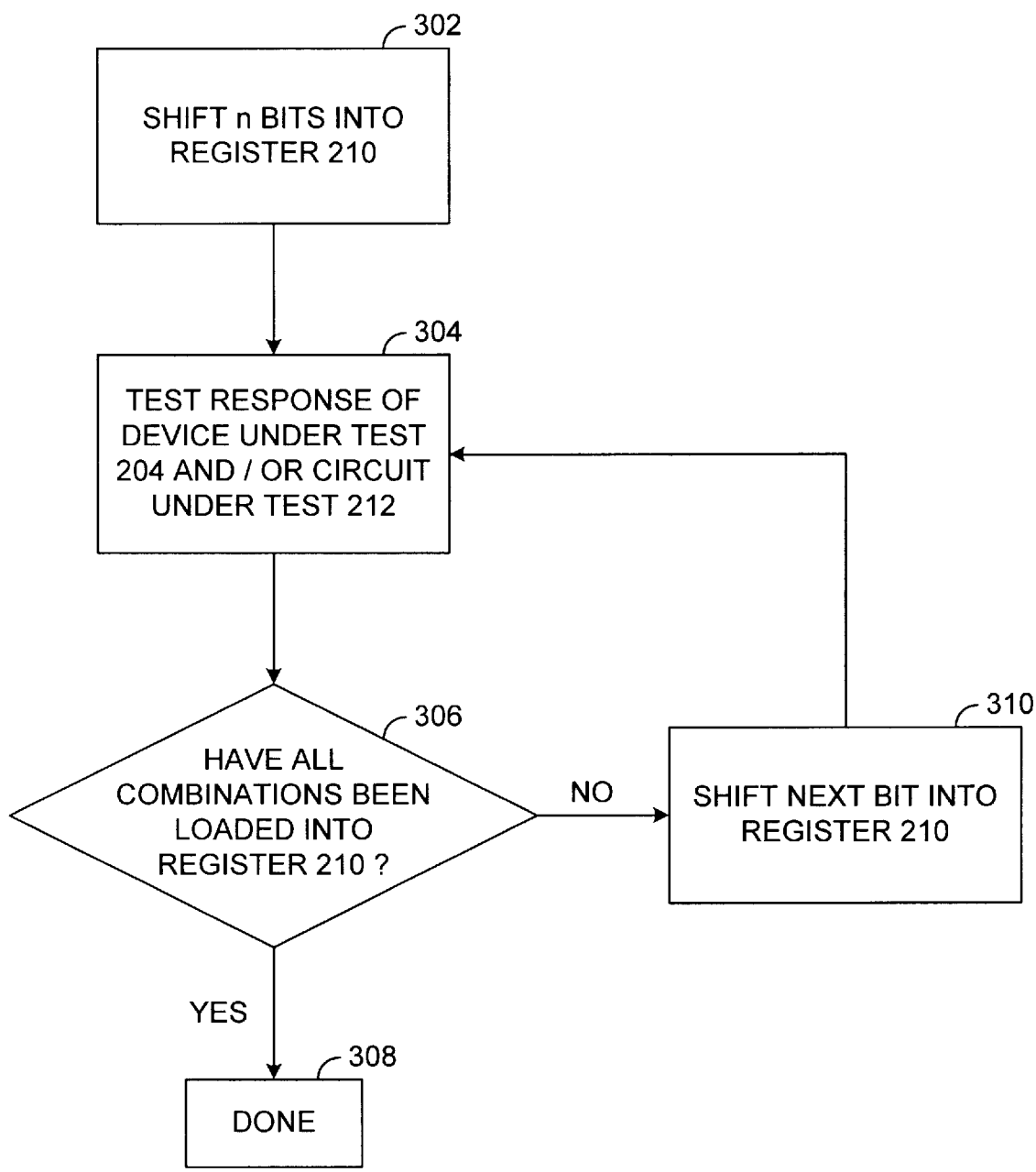
FIG. 3 is a flow chart illustrating a method of using the test pattern for testing a device according to one embodiment of the present invention.

The operation of the system 200 may be summarized as illustrated in FIG. 3. At step 302, n bits of the serial test pattern generated in FIG. 1 are loaded into register 210. Sequence detecting state machine 214 and/or circuit under test 212 monitor and evaluate the n bits in register 210. At step 304, the response of device under test 204 is monitored. The response may be monitored by another device communicating with device under test 204, or by monitoring the outputs of device under test 204.

At step 306, it is determined whether all $2^n$ combinations of n-bit patterns have been loaded into register 210. If all $2^n$ combinations have not been loaded into register 210, then the next bit in the serial test pattern sequence is shifted into register 210. The next bit is determined by the method illustrated in FIG. 1. A new n-bit pattern now resides in register 210. Steps 304, 306, and 310 are repeated until all $2^n$ combinations of n-bit patterns have been loaded into register 210 and the response by device under test 204, sequence detecting state machine 214, or circuit under test 212 has been monitored. When all $2^n$ combinations have been loaded into register 210, the process stops at step 308.

Figure 4:
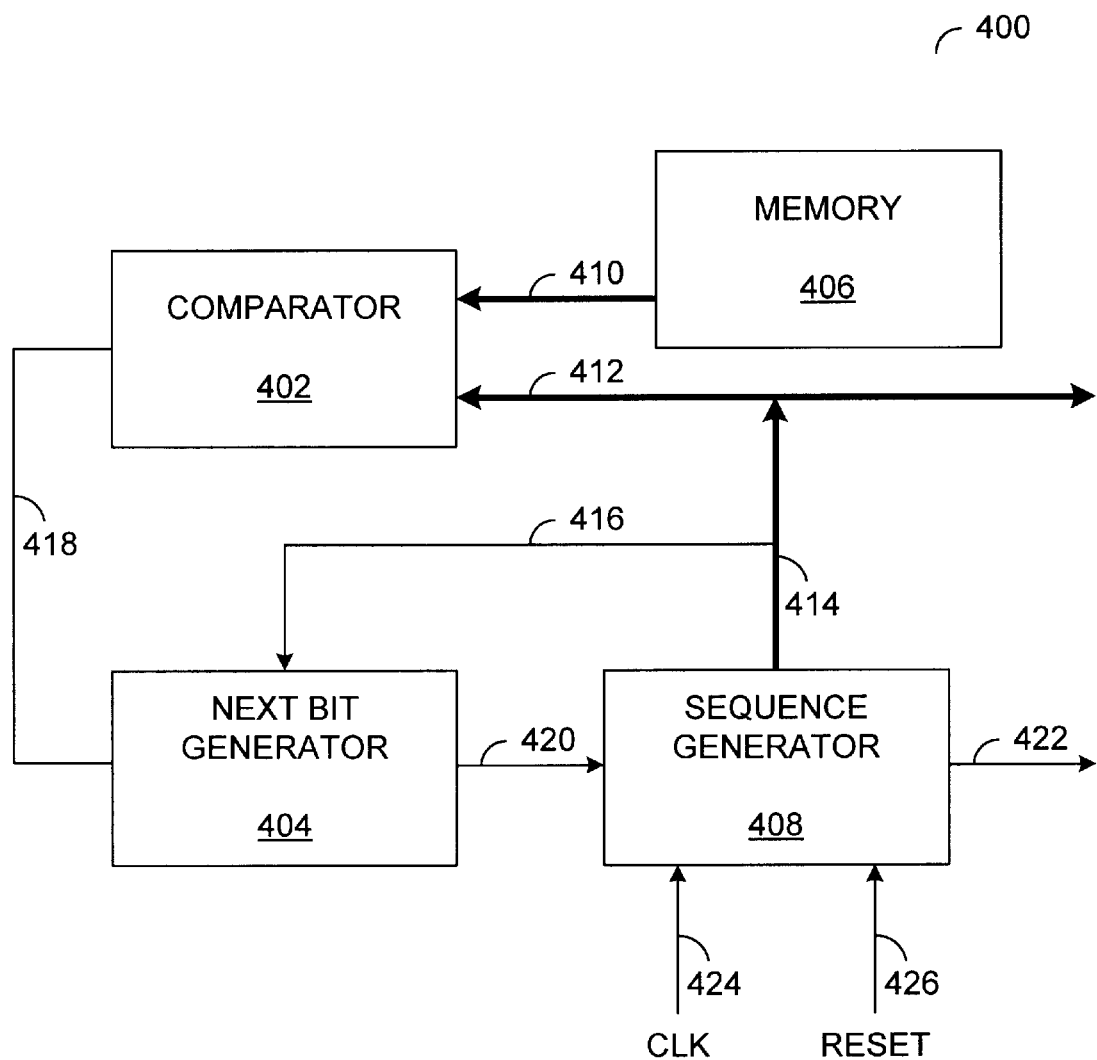
FIG. 4 is a block diagram of one embodiment of a pattern generator according to the present invention.

FIG. 4 illustrates pattern generator 400 which is one embodiment of pattern generator 208 illustrated in FIG. 2. Pattern generator 400 implements the method of FIG. 1. Pattern generator 400 includes sequence generator 408. Sequence generator 408 outputs the serial test pattern to serial output line 422 in response to the clock signal CLK on line 424. Serial output line 422 may comprise line 216 in FIG. 2. Sequence generator 408 also outputs n-bit parallel data on bus 414. Bus 414 is coupled to bus 412.

Pattern generator 400 also includes comparator 402 receiving input data from memory 406 over bus 410 and parallel n-bit data from sequence generator 408 over bus 412. Comparator 402 outputs a comparison result signal on line 418 to next bit generator 404. Next bit generator 404 receives the comparison result signal on line 418. Next bit generator 404 also receives on line 416 one or more of n bits in the n-bit pattern generated by sequence generator 408. Next bit generator 404 outputs a next bit on line 420 to sequence generator 408.

The operation of pattern generator 400 will be described with reference to FIG. 1.

At step 102, pattern generator 400 generates an initial n-bit sequence of bits or signals for the serial test pattern. The initial n-bit pattern is provided in parallel onto bus 412 and may be serially clocked out of sequence generator 408 onto serial output line 422 in response to CLK on line 424. The initial pattern may be a default state that occurs in response to the reset signal on line 426. For one embodiment the initial pattern is all zeros. For another embodiment, the initial pattern is all ones.

At step 104, comparator 402 compares a value of the n-bit pattern on bus 412 with a range of predetermined numbers provided by memory 406 on bus 410. Memory 406 may comprise RAM, ROM or any other type of storage medium for storing the predetermined range of numbers.

For one embodiment, the range of predetermined numbers is from one to $2^{n-1}$ inclusive. For another embodiment, the range of numbers comprises zero and the range of $2^{n-1}+1$ to $2^n$ inclusive. For another embodiment, the range of predetermined numbers is from $2^{n-1}-1$ to $2^n-2$ inclusive. For another embodiment, the range of predetermined numbers comprises 0 to $2^{n-1}-2$ and $2^n-1$ to $2^n$ inclusive.

At step 106, comparator 402 determines whether the value of the first sequence of n bits is included within the range of predetermined numbers. Comparator 402 outputs the comparison result signal on line 418 is response to the comparison. For one embodiment, the comparison result signal is a high logic state (one) if the n-bit pattern is not within the range of numbers in memory 406, and the comparison result signal is a low logic state (zero) if the n-bit pattern is within the range of numbers in memory 406. For another embodiment, the comparison result signal is a low logic state if the n-bit pattern is not within the range of numbers in memory 406, and the comparison result signal is a high logic state if the n-bit pattern is within the range of numbers in memory 406.

If the value of the first sequence of n bits is included within the range of predetermined numbers, the method transitions to step 108 and next bit generator 404 generates the next bit in the pattern. Next bit generator 404 generates the next bit on line 420 in response to the comparison result signal on line 418 and one of the bits on line 416. For one embodiment, the next bit will have a same state as the last or least significant bit of the first sequence of n bits.

If the value of the first sequence of n bits is not included within the range of predetermined numbers, the method transitions to step 110 and next bit generator 404 generates the next bit in the pattern. Next bit Generator 404 generates the next bit on line 420 in response to the comparison result signal on line 418 and one of the bits on line 416. For one embodiment, the next bit in the pattern will have the complement state of the last or least significant bit of the first sequence of n bits.

For another embodiment, the next bit may have a state which is logically derived from the state of another bit or bits in the first sequence of bits.

In response to the next clock pulse on line 424, sequence generator 408 will output one of the n bits on serial output line 422 and clock the next bit into the least significant bit location on bus 414.

Both steps 108 and 110 transition to step 112 after next bit generator 404 has generated the next bit on line 420. If all $2^n$ combinations for the n-bit pattern have been generated, the process stops at step 114. If all $2^n$ combinations for the n-bit pattern have not been generated, comparator 402 compares the next group of n bits on bus 412 with the range of predetermined numbers on bus 410 at step 116. The next group of n bits is the first sequence of n bits shifted by one location and having a least significant bit equal to the next bit determined in step 108 or step 110. The process then transitions back to step 106.

For another embodiment, the process does not stop if all $2^n$ combinations of the n-bit pattern have been generated; rather, the process continues to cycle through the unique pattern generated by the process of FIG. 1.

Figure 5:
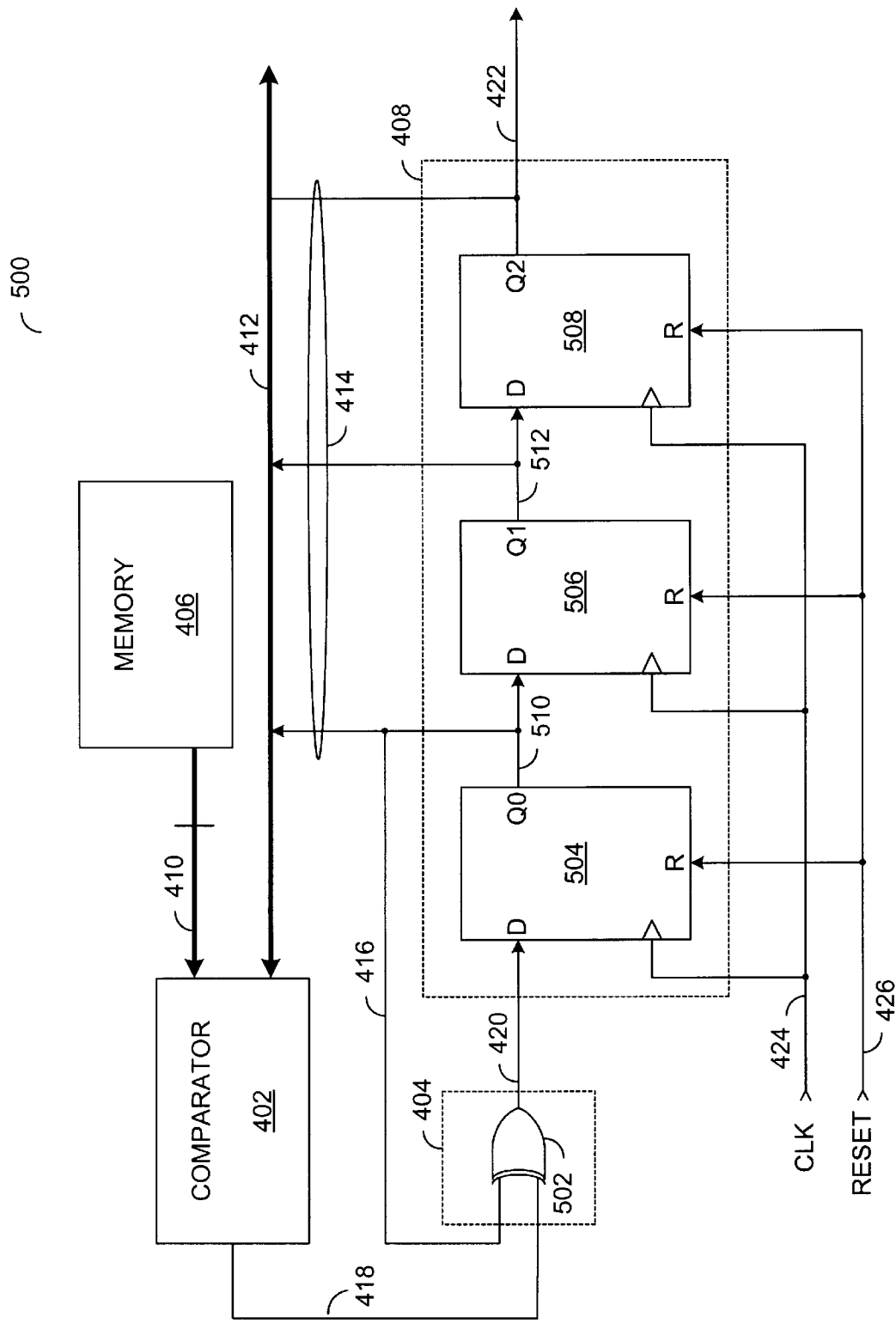
FIG. 5 is a circuit diagram of another embodiment of a pattern generator according to the present invention.

FIG. 5 illustrates pattern generator 500 which is one embodiment of pattern generator 400 illustrated in FIG. 4 for n equal to three. Reference numerals in FIG. 5 which are like, similar, or identical to reference numerals in FIG. 4 indicate like, similar, or identical components. Pattern generator 500 includes next bit generator 404 which comprises exclusive or (XOR) gate 502. Additionally, pattern generator 500 includes sequence generator 408 which comprises D-type registers 504, 506, and 508. Registers 504, 506, and 508 output a three-bit pattern to bus 412 and output the serial test pattern onto serial output line 422.

Each of registers 504, 506, and 508 receive the clock signal CLK on line 424 and the reset signal on line 426. Register 504 has its D input coupled to receive the next bit on line 420 from XOR gate 502. The Q output of register 504, QO, is coupled to bus 412 and line 416. Line 416 is one input to XOR gate 502. The other input of XOR gate 502 receives the comparison result signal from comparator 402 on line 418.

Register 504 has its Q output, QO, coupled to the D input of register 506 on line 510. The Q output of register 506 is coupled to the D input of register 508 and bus 412 on line 512. The Q output of register 508, Q2, is coupled to serial output line 422 and bus 412. It will be appreciated that the serial test pattern may be output not only from serial output line 422, but also from line 510 or line 512. Alternatively, the serial test pattern may be output from line 420.

The operation of pattern generator 500 will be described with reference to FIG. 1. For this example, n equals three and the test pattern generated by FIG. 1 is 0001110100.

At step 102, the reset signal on line 426 is set to a high logic state in order to reset the Q outputs of registers 504, 506, and 508 to a low logic state. Thus, the initial three-bit pattern is 000 which is present on nodes 422, 512, and 510, respectively. As the next bit is clocked into register 504, the previous n bits will be clocked out toward serial output line 422.

At step 104, comparator 402 compares 000 on bus 412 with a range of predetermined numbers from memory 406 on bus 410. For this embodiment, the range of predetermined numbers is from one to $2^n 2-1$, or {1,4} inclusive.

At step 106, comparator 402 determines that zero (000) is not within the range {1,4}, and comparator 402 outputs a comparison result signal on line 418 having a high logic state.

At step 110, XOR gate 502 receives the high logic state on line 418 and the low logic state on line 416 and generates a next bit on line 420 having a high logic state. Thus, the next bit on line 420 is the complement of the last or least significant bit on line 510 and line 416.

In response to the next clock pulse on line 424, sequence generator 408 will output 001 on lines 422, 512, and 510, respectively.

At step 112, it is determined that not all of the eight ($2^3$) combinations of the three-bit pattern have been generated, and the process transitions to step 116. At step 116, the next three bits are compared with the range {1,4} by comparator 402. The next three bits now comprise 001 and have a decimal value of one.

At step 106, comparator 402 determines that 001 is within the range {1,4} and outputs a comparison result signal on line 418 having a low logic state.

At step 108, XOR gate 502 receives the low logic state on line 418 and the high logic state on line 416 and generates a next bit on line 420 having a high logic state. Thus, the next bit on line 420 is the same state of the last or least significant bit on line 510 and line 416.

In response to the next clock pulse on line 424, sequence generator 408 will output 011 on lines 422, 512, and 510, respectively.

The process will continue through steps 106, 108, 110, 112, and 116 until all eight ($2^3$) combinations for the three-bit pattern have been generated by sequence generator 408. A full summary of the serial pattern generation is illustrated in Table 1 above.

It will be appreciated that the circuits illustrated in FIG. 5 for next bit generator 404 and sequence generator 408 may be replaced with other circuits as is generally known in the art to achieve the same function as pattern generator 500. Additionally, the circuits illustrated in FIG. 5 may be altered as generally known in the art to respond to other ranges of numbers described in this application.

Figure 6:
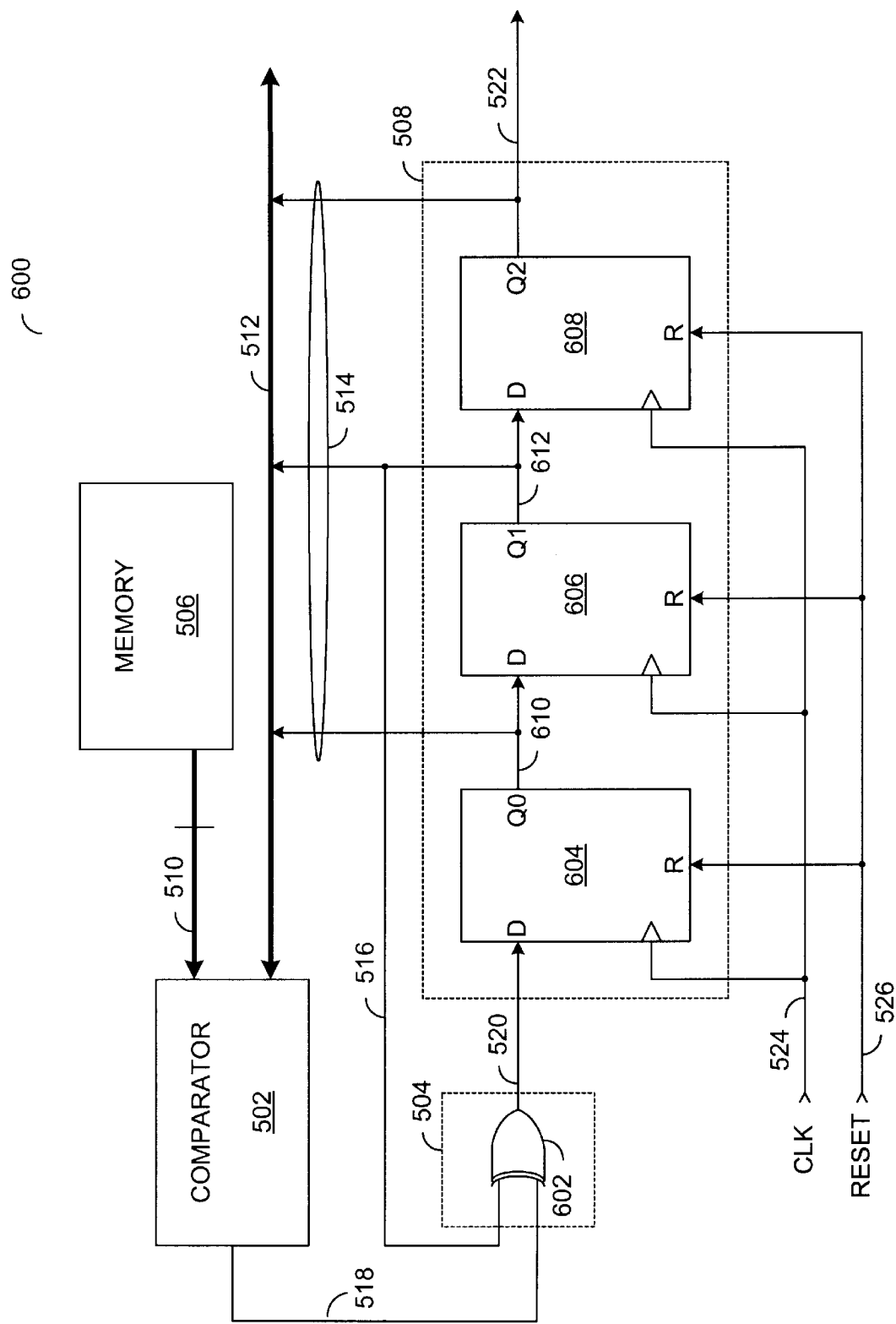
FIG. 6 is a circuit diagram of yet another embodiment of a pattern generator according to the present invention.

FIG. 6 illustrates pattern generator 600 which is another embodiment of pattern generator 400 illustrated in FIG. 4 for n equal to three. Reference numerals in FIG. 6 which are like, similar, or identical to reference numerals in FIGS. 4 and 5 indicate like, similar or identical components. Pattern generator 600 includes next bit generator 504 which comprises exclusive or (XOR) gate 602. Additionally, pattern generator 600 includes sequence generator 508 which comprises D-type registers 604, 606 and 608. Registers 604, 606 and 608 output a three-bit pattern to bus 512 and output the serial test pattern onto serial output line 522.

Each of registers 604, 606, and 608 receive the clock signal CLK on line 524 and the reset signal on line 526. Register 604 has it D input coupled to receive the next bit on line 520 from XOR gate 602. The Q output of register 604, QO, is coupled to bus 512. Line 516 is one input to XOR gate 602. The other input of XOR gate 602 receives the comparison result signal from comparator 502 on line 518.

Register 604 has its Q output, QO, coupled to the D input of register 606 on line 610. The Q output of register 606, Q1, is coupled to the D input of register 608, line 516 and bus 512 on line 612. The Q output of register 608, Q2, is coupled to serial output line 522 and bus 512. It will be appreciated that the serial test pattern may be output not only from serial output line 522, but also from line 610 or line 612. Alternatively, the serial test pattern may be output from line 520.

The operation of pattern generator 600 will be described with reference to FIG. 1. For this example, n equals three and the test pattern generated by FIG. 1 is 00010111000. Reading three bit groups from left to right, this pattern covers the three-bit patterns from zero to seven in the order of: 0, 1, 2, 5, 3, 7, 6 and 4.

At step 102, the reset signal on line 526 is set to a high logic state in order to reset the Q outputs of registers 604, 606, and 608 to a low logic state. Thus, the initial three-bit pattern is 000 which is present on nodes 522, 612, and 610, respectively. As the next bit is clocked into register 604, the previous n bits will be clocked out toward serial output line 522.

At step 104, comparator 502 compares 000 on bus 512 with a range of predetermined numbers from memory 506 on bus 510. For this embodiment, the range of predetermined numbers is from one to $2^n-1$ or {1,4} inclusive.

At step 106, comparator 502 determines that zero (000) is not within the range {1,4}, and comparator 502 outputs a comparison result signal on line 518 having a high logic state.

At step 110, XOR gate 602 receives the high logic state on line 518 and the low logic state on line 516 and generates a next bit on line 520 having a high logic state. Thus, the next bit on line 520 is the complement of the bit on line 612 and line 516.

In response to the next clock pulse on line 524, sequence generator 508 will output 001 on lines 522, 612, and 610, respectively.

At step 112, it is determined that not all of the eight ($2^3$) combinations of the three-bit pattern have been generated, and the process transitions to step 116. At step 116, the next three bits are compared with the range {1,4} by comparator 502. The next three bits now comprise 001 and have a decimal value of one.

At step 106, comparator 502 determines that 001 is within the range {1,4} and outputs a comparison result signal on line 518 having a low logic state.

At step 108, XOR gate 602 receives the low logic state on line 518 and the low logic state on line 516 and generates a next bit on line 520 having a low logic state. Thus, the next bit on line 520 is the same state of the bit on line 612 and line 516.

In response to the next clock pulse on line 524, sequence generator 508 will output 010 on lines 522, 612, and 610, respectively.

The process will continue through steps 106, 108, 110, 112, and 116 until all eight ($2^3$) combinations for the three-bit pattern have been generated by sequence generator 508. A full summary of the serial pattern generation of this example is illustrated in Table 2.

TABLE 2

| n bits | base 10 | bit on line 612 | next bit |
|--------|---------|-----------------|----------|
| 000    | 0       | 0               | 1        |
| 001    | 1       | 0               | 0        |
| 010    | 2       | 1               | 1        |
| 101    | 5       | 0               | 1        |
| 011    | 3       | 1               | 1        |
| 111    | 7       | 1               | 0        |
| 110    | 6       | 1               | 0        |
| 100    | 4       | 0               | 0        |

It will be appreciated that the circuits illustrated in FIG. 6 for next bit generator 504 and sequence generator 508 may be replaced with other circuits as is generally known in the art to achieve the same function as pattern generator 600. Additionally, the circuits illustrated in FIG. 6 may be altered as generally known in the art to respond to other ranges of numbers described in this application.

FIGS. 5 and 6 illustrate that for each case of n there exists at least two possible solutions for generating a serial pattern having n-bit patterns from zero to $2^n-1$. For example, with n=3 in FIG. 5, the output QO of register 504 is fed back as one of the inputs to next bit generator 404 via line 416. With n=3 in FIG. 6, the output Q1 of register 606 is fed back as one of the inputs to next bit generator 504 via line 516.

Figure 7:
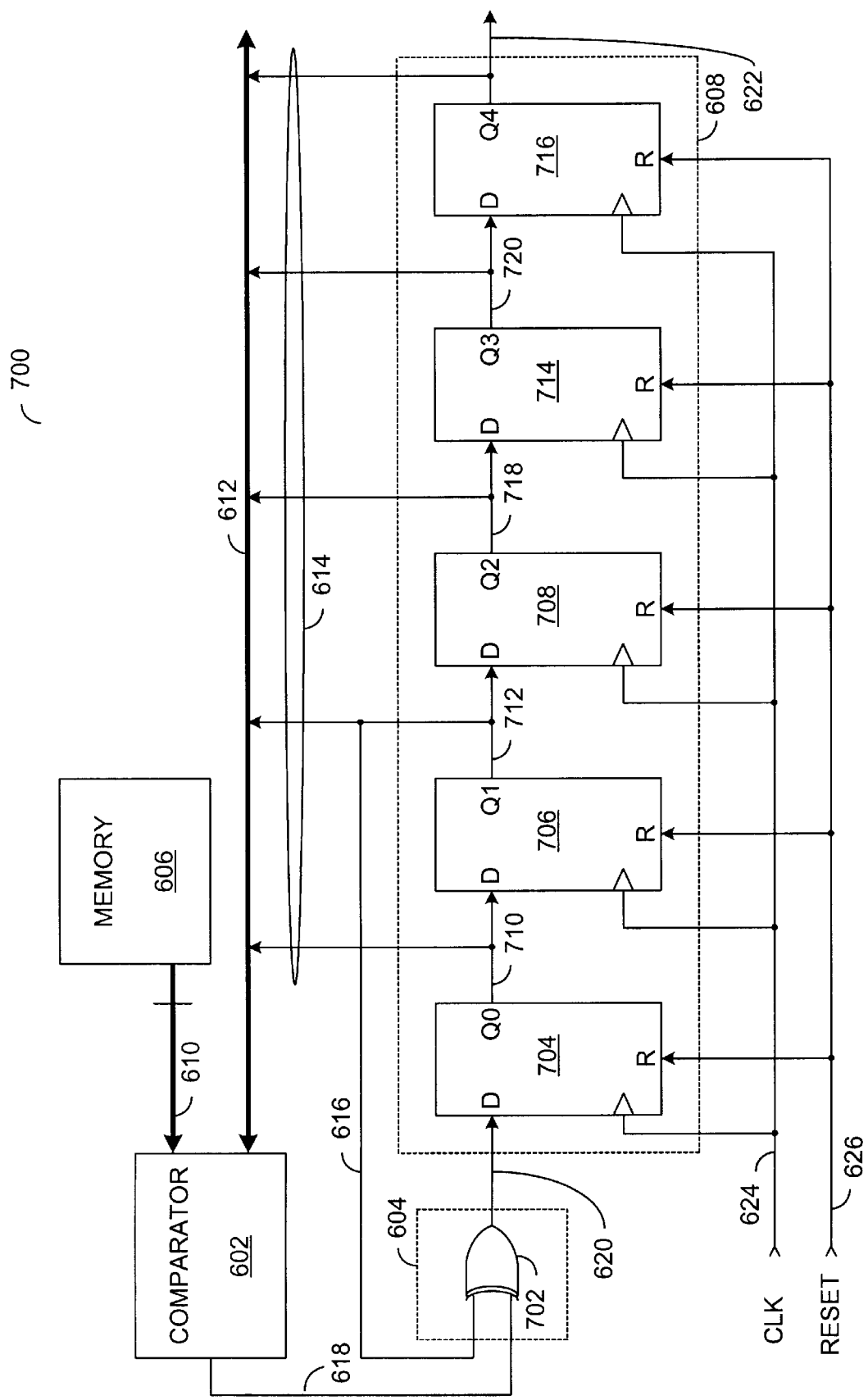
FIG. 7 is a circuit diagram of yet another embodiment of a pattern generator according to the present invention.

FIG. 7 illustrates pattern generator 700 which is yet another embodiment of pattern generator 400 illustrated in FIG. 4 for n equal to five. Reference numerals in FIG. 7 which are like, similar or identical to reference numerals in FIGS. 5 and 6 indicate like, similar or identical components. Pattern generator 700 further includes D-type registers 714 and 716 which, in addition to registers 704, 706 and 708, also receive the clock CLK on line 624 and the reset signal on line 626. Register 708 has its Q output, Q2, coupled to the D input of register 714 and to bus 612 on line 718. The Q output of register 714, Q3, is coupled to the D input of register 716 and to bus 612 on line 720. The Q output of register 716, Q4, is coupled to bus 612 and serial output line 622. Line 616 may be coupled to either output Q1 of register 706 as shown or output Q2 or register 708 (not shown). Pattern generator 700 generates a serial pattern having 5 bit patterns from zero to thirty one utilizing the method described with reference to FIG. 1. FIG. 7 illustrates that, for some cases of n, the solutions for generating a serial pattern having n-bit patterns from zero to $2^n-1$ may not require feeding back the output Q0 of register 704 as one of the inputs to next bit generator 604 via line 616.

Figure 8:
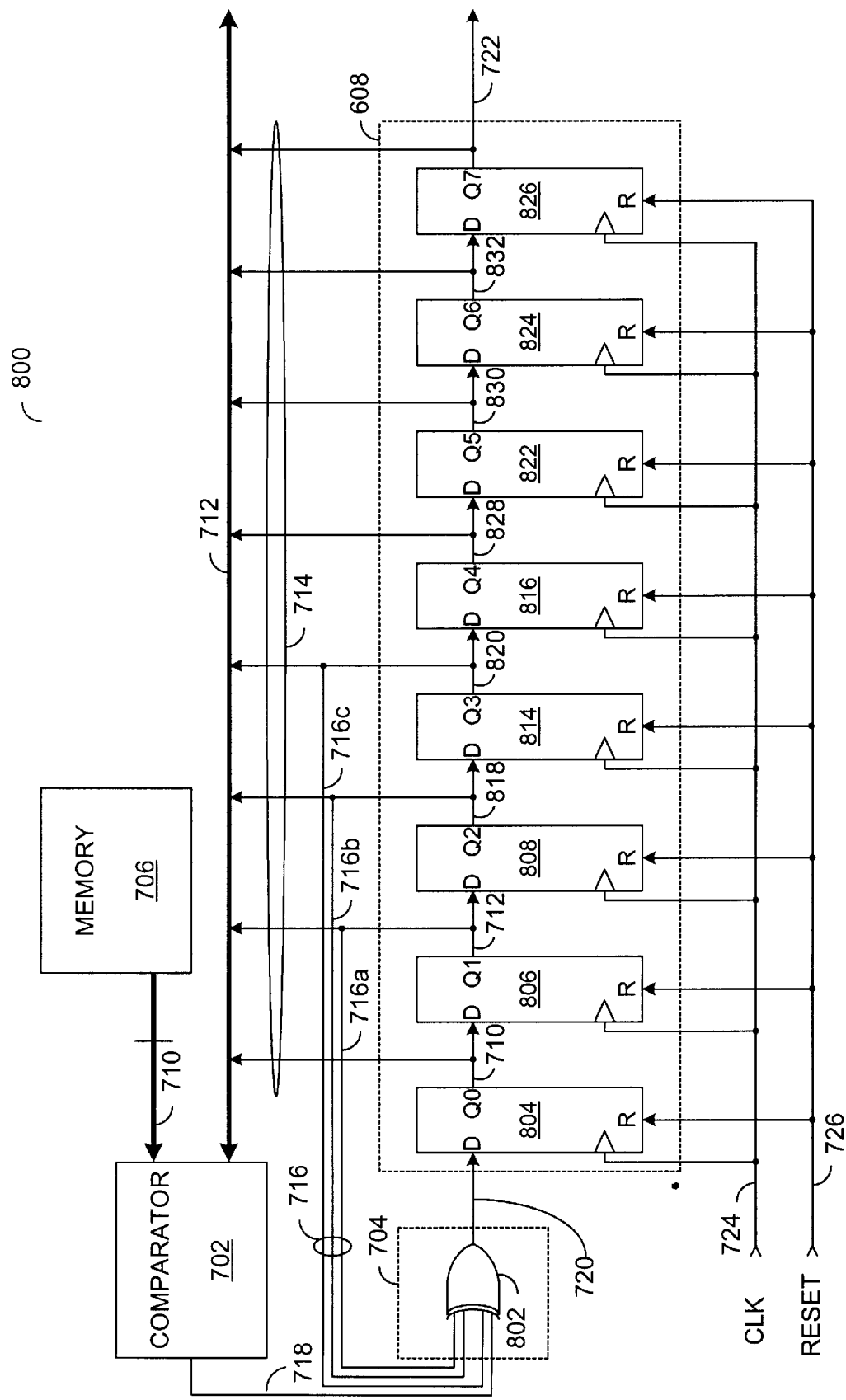
FIG. 8 is a circuit diagram of yet another embodiment of a pattern generator according to the present invention.

FIG. 8 illustrates pattern 800 which is yet another embodiment of pattern generator 400 illustrated in FIG. 4 for n equal to eight. Reference numerals in FIG. 8 which are like, similar or identical to reference numerals in FIGS. 5, 6 and 7 indicate like, similar or identical components. Pattern generator 800 further includes D-type registers 822, 824 and 826 which, in addition to registers 804, 806, 808, 814 and 816, also receive the clock CLK on line 724 and the reset signal on line 726. Register 816 has its Q output, Q4, coupled to the D input of register 822 and to bus 712 on line 828. The Q output of register 822, Q5, is coupled to the D input of register 824 and to bus 712 on line 830. The Q output of register 824, Q6, is coupled to the D input of register 826 and to bus 712 on line 832. The Q output of register 826, Q7, is coupled to bus 712 and serial output line 722. Line 716 includes lines 716a, 716b and 716c which may be coupled to output Q1, Q2 and Q3 of registers 806, 808 and 814, respectively at one end and to XOR gate 802 at the other. Thus, in addition to the input received from comparator 702, XOR gate 802 receives as inputs lines 716a, 716b and 716c. Lines 716a, 716b and 716c may also be coupled to outputs Q4, Q2, Q0, outputs Q4, Q2, Q1, outputs Q5, Q2, Q1 or outputs Q5, Q4, Q0, respectively.

Pattern generator 800 generates a serial pattern having 8 bit patterns from zero to 255 utilizing the method described with reference to FIG. 1. FIG. 8 illustrates that, for some cases of n, the solutions for generating a serial pattern having n-bit patterns from zero to $2^n-1$ may require feeding back multiple Q outputs from registers in sequence generator 708 as inputs to next bit generator 704 via line 716.

Figure 9:
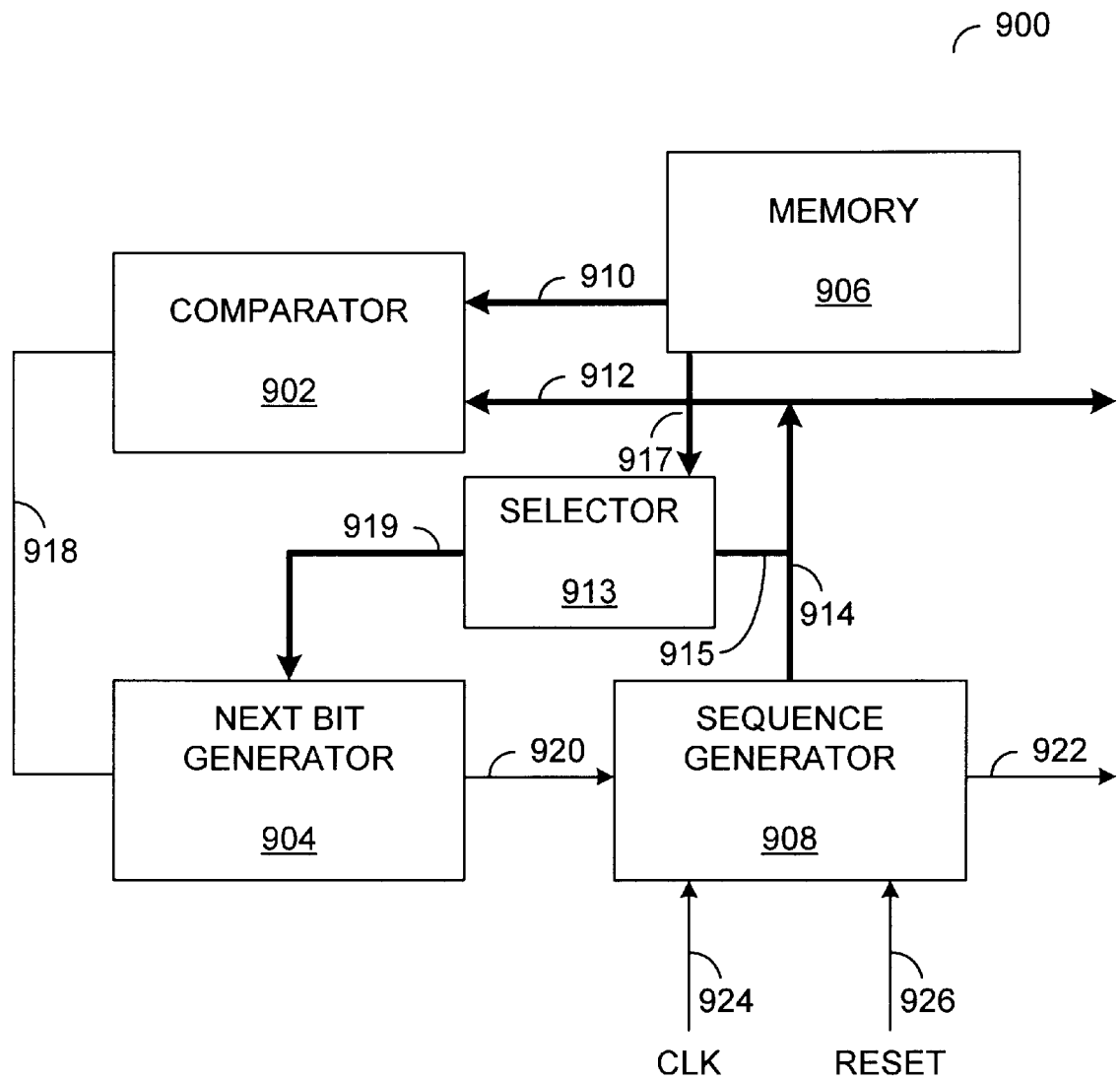
FIG. 9 is a block diagram of another embodiment of a pattern generator according to the present invention.

FIG. 9 illustrates pattern generator 900 which is another embodiment of pattern generator 208 illustrated in FIG. 2. Reference numerals in FIG. 9 which are like, similar or identical to reference numerals in FIG. 4 indicate like, similar or identical components. Instead of next bit generator 404 receiving one or more of n bits in the n-bit pattern generated by sequence generator 408 on a hard-wired line 416 as in FIG. 4, in this embodiment next bit generator 904 receives one or more of n bits in the n-bit pattern generated by sequence generator 908 from a selector 913. In one embodiment, selector 913 may include a multiplexer. Selector 913 receives as one input all of the bits in the n-bit pattern generated by sequence generator 908 from a bus 915 coupled to bus 914. Selector 913 receives as another input bits indicating the value of n from memory 906 via a bus 917. For example, if n=5, then selector 913 receives as an input parallel bits 101 on bus 917. Selector 913 utilizes the input bits received on bus 917 to select which of the bits in the n-bit pattern (i.e., the bits inputted to selector 913 on line 915) will be sent, passed on or fed back to next bit generator 904 via an output bus 919 coupling selector 913 to next bit generator 904. Selector 913 selects which bits to feed back to next bit generator 904 based on the value of n as will be more fully described with reference to FIG. 10. In this manner pattern generator 900 implements the method of FIG. 1 for all values of n and allows the serial pattern generated by sequence generator 908 to be programmable.

Figure 10:
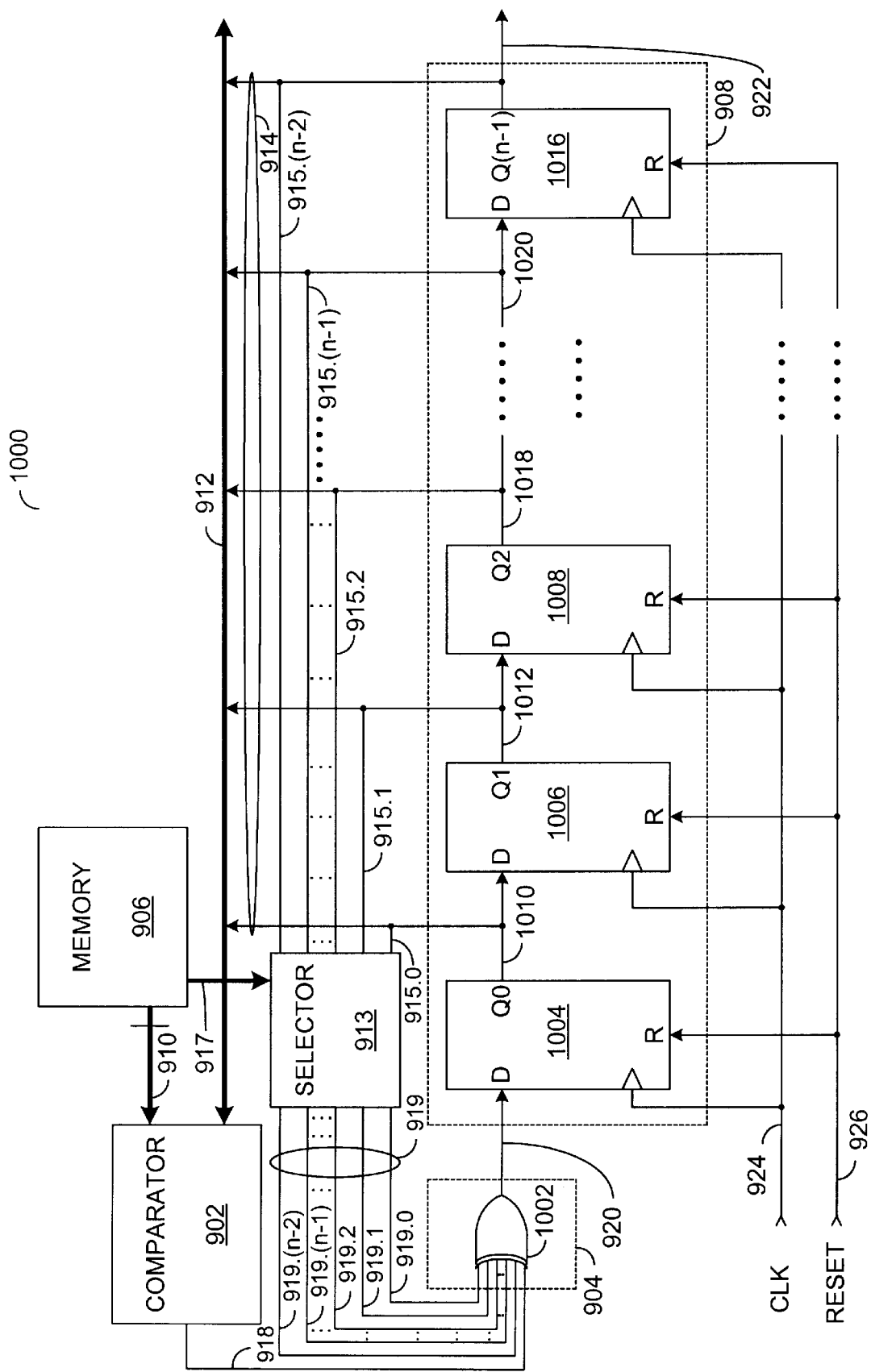
FIG. 10 is a circuit diagram of another embodiment of a pattern generator according to the present invention.

FIG. 10 illustrates pattern generator 1000 which is one embodiment of pattern generator 900 illustrated in FIG. 9. Reference numerals in FIG. 10 which are like, similar or identical to reference numerals in FIGS. 7 and 9 indicate like, similar or identical components. Pattern generator 1000 includes next bit generator 904 which comprises an n-bit input exclusive or (XOR) gate 1002. Additionally, pattern generator 1000 includes sequence generator 908 which comprises n D-type registers 1004, 1006, 1008, 1016 outputting an n-bit pattern to bus 912 via bus 914 from outputs Q0, Q1, Q2, . . . , Q(N−1), respectively, and outputting the serial test pattern onto serial output line 922. Selector 913 selects which outputs Q0, Q1, Q2, . . . , Q(N−1) received from lines 915.0, 915.1, 915.2, . . . , 915.(N−1) of bus 915, respectively, to pass through as inputs to XOR gate 1002 via lines 919.0, 919.1, 919.2, . . . , 919.(M−2) or 919.(M−1) of bus 919 based on the value of n inputted to multiplexer 913 from memory 906 via bus 917. The following Table 3 illustrates one set of solutions, i.e., which Q outputs multiplexer 913 selects or passes on to next bit generator 904, for n=2 through n=73.

TABLE 3

| n | Select |
|---|---|
| 2 | Q0 |
| 3 | Q0 |
| 4 | Q0 |
| 5 | Q1 |
| 6 | Q0 |
| 7 | Q0 |
| 8 | Q3 Q2 Q1 |
| 9 | Q3 |
| 10 | Q2 |
| 11 | Q1 |
| 12 | Q5 Q3 Q0 |
| 13 | Q3 Q2 Q0 |
| 14 | Q4 Q2 Q0 |
| 15 | Q0 |
| 16 | Q4 Q2 Q1 |
| 17 | Q2 |
| 18 | Q6 |
| 19 | Q4 Q1 Q0 |
| 20 | Q2 |
| 21 | Q1 |
| 22 | Q0 |
| 23 | Q4 |
| 24 | Q3 Q2 Q0 |
| 25 | Q2 |
| 26 | Q5 Q1 Q0 |
| 27 | Q4 Q1 Q0 |
| 28 | Q2 |
| 29 | Q1 |
| 30 | Q5 Q3 Q0 |
| 31 | Q2 |
| 32 | Q6 Q5 Q1 |
| 33 | Q12 |
| 34 | Q7 Q3 Q2 |
| 35 | Q1 |
| 36 | Q10 |
| 37 | Q5 Q3 Q0 |
| 38 | Q5 Q4 Q0 |
| 39 | Q3 |
| 40 | Q4 Q3 Q2 |
| 41 | Q2 |
| 42 | Q6 Q3 Q2 |
| 43 | Q5 Q3 Q2 |
| 44 | Q5 Q4 Q1 |
| 45 | Q3 Q2 Q0 |
| 46 | Q7 Q6 Q5 |
| 47 | Q4 |

TABLE 3-continued

| n | Select |
|---|---|
| 48 | Q8 Q6 Q3 |
| 49 | Q8 |
| 50 | Q3 Q2 Q1 |
| 51 | Q5 Q2 Q0 |
| 52 | Q2 |
| 53 | Q5 Q1 Q0 |
| 54 | Q7 Q5 Q2 |
| 55 | Q23 |
| 56 | Q6 Q3 Q1 |
| 57 | Q6 |
| 58 | Q18 |
| 59 | Q6 Q3 Q1 |
| 60 | Q0 |
| 61 | Q4 Q1 Q0 |
| 62 | Q5 Q4 Q2 |
| 63 | Q0 |
| 64 | Q3 Q2 Q0 |
| 65 | Q17 |
| 66 | Q8 Q7 Q5 |
| 67 | Q4 Q1 Q0 |
| 68 | Q8 |
| 69 | Q5 Q4 Q1 |
| 70 | Q4 Q2 Q0 |
| 71 | Q5 |
| 72 | Q9 Q8 Q2 |
| 73 | Q24 |

It will be appreciated that for each value of n, there are multiple solutions as discussed in reference to the description of FIGS. 5 and 6 for n=3.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method for generating a serial pattern having a first plurality of bits, the method comprising the steps of:

generating a second plurality of bits having a first value, wherein the second plurality of bits includes less bits than the first plurality of bits;

comparing the first value with one or more numbers to generate a comparison result; and generating a next bit in the serial pattern based upon the comparison result and at least one bit of the second plurality of bits.

2. The method of claim 1, further comprising the steps of:

shifting the second plurality of bits, wherein the second plurality of bits has a second value and a least significant bit; and loading the least significant bit with the next bit.

3. The method of claim 1, wherein the generating step includes:

generating the next bit in the serial pattern having a first state if the first value is equal to one of the one or more numbers; and generating the next bit in the serial pattern having a second state which is the complement of the first state if the first value is not equal to any of the one or more numbers.

4. The method of claim 1, wherein the generating step includes:

generating the next bit in the serial pattern having a first state if the first value is not equal to any of the one or more numbers; and generating the next bit in the serial pattern having a second state which is the complement of the first state if the first value is equal to one of the one or more numbers.

5. The method of claim 1, wherein the second plurality of bits comprises n bits, and the at least one number comprises one through $2^{n-1}$ inclusive.

6. The method of claim 1, wherein the second plurality of bits comprises n bits, and the at least one number comprises $2^{n-1}-1$ through $2^n-2$ inclusive.

7. The method of claim 1, further comprising the step of:
selecting one or more bits from the second plurality of bits based on the number of bits in the second plurality of bits.

8. The method of claim 7, wherein the generating step includes generating the next bit in the serial pattern based upon the comparison result and the one or more bits selected in the selecting step.

9. A pattern generator comprising:
a sequence generator configured to output a serial sequence of bits and a plurality of bits having a value;
a comparator coupled to the sequence generator, the comparator configured to receive the plurality of bits and one or more numbers and to compare the value with the one or more numbers and generate a comparison result; and
a next bit generator coupled to the comparator and the sequence generator configured to receive the comparison result and at least one of the plurality of bits and generate a next bit for the serial sequence of bits.

10. The pattern generator of claim 9, wherein:
the comparison result is a first result value when the value of the plurality of bits is equal to one of the one or more numbers; and
the comparison result is a second result value when the value of the plurality of bits is not equal to any of the one or more numbers.

11. The pattern generator of claim 10, wherein:
the next bit has a first state if the comparison result is the first result value; and
the next bit has a second state which is the complement of the first state if the comparison result is the second result value.

12. The pattern generator of claim 10, wherein:
the next bit has a first state if the comparison result is the second result value; and
the next bit has a second state which is the complement of the first state if the comparison result is the first result value.

13. The pattern generator of claim 9, further comprising:
a memory coupled to the comparator and configured to store the one or more numbers.

14. The pattern generator of claim 9, wherein the next bit generator includes an exclusive OR (XOR) logic gate.

15. The pattern generator of claim 9, wherein the sequence generator includes a plurality of registers coupled to one another so as to be configured to receive the next bit from the next bit generator and output the plurality of bits to the comparator.

16. The pattern generator of claim 9, wherein the plurality of bits comprises n bits, and the at least one number comprises one through $2^{n-1}$ inclusive.

17. The pattern generator of claim 9, wherein the plurality of bits comprises n bits, and the at least one number comprises $2^{n-1}-1$ through $2^n-2$ inclusive.

18. The pattern generator of claim 9, wherein the pattern generator is included in a system, the system further comprising:
a device under test coupled to the pattern generator and configured to receive the serial sequence of bits, wherein the device under test is tested in response to the serial sequence of bits.

19. The pattern generator of claim 18, wherein the device under test includes a memory device, a programmable logic device, a data communications device, a built-in-self-test circuit (BIST), or a digital signal processing device.

20. The pattern generator of claim 18, further comprising:
a link configured to couple the device under test to the pattern generator such that the device under test receives the serial sequence of bits to test the device under test.

21. The pattern generator of claim 9, further comprising:
a selector configured to select one or more bits from the plurality of bits based on the number of bits in the plurality of bits.

22. The pattern generator of claim 21, wherein said next bit generator is configured to derive the state of the next bit from the one or more bits selected by the selector and the comparison result.

23. The pattern generator of claim 21 further comprising:
a memory coupled to the selector wherein the memory is configured to store the number of bits in the plurality of bits.

24. The pattern generator of claim 21, wherein the selector is coupled to the sequence generator and next bit generator and configured to receive the plurality of bits from the sequence generator and select and forward one or more bits from the plurality of bits to the next bit generator.

25. A medium readable by a digital signal processing device, the medium storing a sequence of instructions for generating a pattern including a first plurality of bits, wherein the sequence of instructions are readable to cause the digital signal processing device to:
generate a second plurality of bits having a first value, wherein the second plurality of bits includes less bits than the first plurality of bits;
compare the first value with one or more numbers to generate a comparison result; and
generate a next bit in the serial pattern based upon the comparison result and at least one bit of the second plurality of bits.

26. The medium of claim 25, wherein the sequence of instructions further causes the digital signal processing device to:
shift the second plurality of bits, wherein the second plurality of bits have a second value and a least significant bit; and
load the least significant bit with the next bit.

27. The medium of claim 25, wherein the sequence of instructions further causes the digital signal processing device to:
generate the next bit in the serial pattern having a first state if the first value is equal to one of the one or more numbers; and
generate the next bit in the serial pattern having a second state which is the complement of the first state if the first value is not equal to any of the one or more numbers.

28. The medium of claim 25, wherein the sequence of instructions further causes the digital signal processing device to:

generate the next bit in the serial pattern having a first state if the first value is not equal to any of the one or more numbers; and generate the next bit in the serial pattern having a second state which is the complement of the first state if the first value is equal to one of the one or more numbers.

29. The medium of claim 25, wherein the sequence of instructions further causes the digital signal processing device to:

select one or more bits from the second plurality of bits based on the number of bits in the second plurality of bits.

30. The medium of claim 29, wherein the sequence of instructions further causes the digital signal processing device to:

generate the next bit in the serial pattern based upon the comparison result and the one or more bits selected from the second plurality of bits.

31. A method of testing a device, the method comprising the steps of:

(A) serially loading a first plurality of n bits having a first value into the device;

(B) testing a response of the device based on the first plurality of n bits;

(C) comparing the first value with one or more numbers to generate a comparison result;

(D) generating a next bit based upon the comparison result and at least one bit from the plurality of bits;

(E) serially loading the next bit into the device to produce a new plurality of n bits having a new value;

(F) testing the response of the device based on the new plurality of n bits;

(G) comparing the new value with the one or more numbers to generate a new comparison result;

(H) generating the next bit based upon the new comparison result and the at least one bit from the new plurality of bits; and (I) repeating steps (E) through (H) until at least every unique pattern which may be represented by n bits has been achieved.

32. The method of testing the device of claim 31, wherein step (I) comprises repeating steps (E) through (H) $2^n-2$ times.

33. The method of testing the device of claim 31, further comprising the step of:

(J) selecting one or more bits from the new plurality of bits based on the number of bits in the new plurality of bits.

34. The method of testing the device of claim 33, wherein step (H) includes generating the next bit in the serial pattern based upon the new comparison result and the one or more bits selected in step (J).

35. The method of testing the device of claim 31, wherein step (H) includes:

generating the next bit in the serial pattern having a first state if the new value is equal to one of the one or more numbers; and generating the next bit in the serial pattern having a second state which is the complement of the first state if the new value is not equal to any of the one or more numbers.

36. The method of testing the device of claim 31, wherein step (H) includes:

generating the next bit in the serial pattern having a first state if the new value is not equal to any of the one or more numbers; and generating the next bit in the serial pattern having a second state which is the complement of the first state if the new value is equal to one of the one or more numbers.

* * * * *